United States Patent
Chandra et al.

(10) Patent No.: US 8,332,798 B2
(45) Date of Patent: Dec. 11, 2012

(54) USING SYNTHESIS TO PLACE MACROS

(75) Inventors: Amit Chandra, Milpitas, CA (US);
Muthukumaravelu Velayoudame, Fremont, CA (US)

(73) Assignee: Apple Inc., Cupertino, CA (US)

( * ) Notice: Subject to any disclaimer, the term of this patent is extended or adjusted under 35 U.S.C. 154(b) by 36 days.

(21) Appl. No.: 13/042,794

(22) Filed: Mar. 8, 2011

(65) Prior Publication Data

US 2012/0233577 A1  Sep. 13, 2012

(51) Int. Cl.
*G06F 17/50* (2006.01)
(52) U.S. Cl. ........ 716/122; 716/104; 716/119; 716/123; 716/135; 716/139
(58) Field of Classification Search .......... 716/104, 716/119, 122–123, 135, 139
See application file for complete search history.

(56) References Cited

U.S. PATENT DOCUMENTS

| | | | | |
|---|---|---|---|---|
| 5,471,398 | A * | 11/1995 | Stephens | 716/104 |
| 6,625,792 | B1 * | 9/2003 | Yamasaki | 716/122 |
| 6,678,646 | B1 * | 1/2004 | McConnell et al. | 703/22 |
| 6,897,496 | B2 * | 5/2005 | Yamada et al. | 257/208 |
| 7,200,827 | B1 * | 4/2007 | Ku et al. | 716/123 |
| 2005/0268258 | A1 * | 12/2005 | Decker | 716/4 |
| 2006/0129964 | A1 | 6/2006 | Shibasaki et al. | |
| 2007/0245280 | A1 | 10/2007 | Van Eijk et al. | |
| 2007/0245281 | A1 * | 10/2007 | Riepe et al. | 716/9 |
| 2007/0266359 | A1 * | 11/2007 | Esbensen et al. | 716/10 |
| 2010/0023910 | A1 * | 1/2010 | Chen et al. | 716/10 |
| 2010/0031214 | A1 * | 2/2010 | Hou et al. | 716/9 |

OTHER PUBLICATIONS

English Abstract for JP 2008-257377 A, published Oct. 23, 2008, 1 page.
English Abstract for JP 2010-135638 A, published Jun. 17, 2010, 1 page.

* cited by examiner

*Primary Examiner* — Naum Levin
(74) *Attorney, Agent, or Firm* — Lawrence J. Merkel; Meyertons, Hood, Kivlin, Kowert & Goetzel, P.C.

(57) ABSTRACT

In one embodiment, a design methodology is described in which a functional description of each macro may be synthesized along with the other logic in a block. The resulting circuitry, including synthesized circuitry corresponding to each macro, may be placed within an area designated for the integrated circuit. The result may be analyzed, determining a location for the macro based on the location of the corresponding synthesized circuitry. For example, the geometric center of the synthesized circuitry may be located, and the geometric center of the custom circuitry associated with the macro may be placed at the same point as the geometric center of the synthesized circuitry. Because the macros are not placed in advance, the location of the macro may be controlled by other factors such as timing, space, wiring congestion, etc.

18 Claims, 4 Drawing Sheets

USING SYNTHESIS TO PLACE MACROS

BACKGROUND

1. Field of the Invention

This invention is related to the field of integrated circuit design and, more particularly, to managing macros during the design of integrated circuits.

2. Description of the Related Art

The design of an integrated circuit, from concept to "tape out" (i.e. the transmission of the data describing the integrated circuit to the fabrication foundry), is a complex series of parallel, interdependent processes such as logic design, circuit design, synthesis, timing analysis, place and route, verification, etc. At each point in the design, the integrated circuit can be represented in a variety of fashions.

Typically, early in the design cycle, the integrated circuit is divided into blocks of functionality. The division can be based on the designer's assessment of a logical and reasonable division, the amount of interconnect that would be needed between blocks, the flow of data through the integrated circuit and the operations to be performed on the data, etc. Within some of the blocks, macros can be defined. A corresponding custom circuit may be designed for each macro, with the goal of implementing desired functionality in an efficient fashion (in terms of space occupied by the circuit, timing, power consumption, etc.). Again, the designer typically determines which circuitry is to be implemented as a macro.

The blocks are generally represented as descriptions in a hardware design language (HDL) such as Verilog, VHDL, etc. For example, register-transfer level (RTL) descriptions are often used. The macros can be instantiated in the RTL descriptions and connected to other circuitry described in the RTL through signal names created in the RTL. Typically, the macros are placed within an area defined for the integrated circuit according to the designer's estimation of an appropriate location based on dataflow, block size and dimensions, and other considerations. The remaining logic in the macro is synthesized, and the corresponding circuitry is placed around the macros.

SUMMARY

In one embodiment, a design methodology is described in which a functional description of each macro may be synthesized along with the other logic in a block. The resulting circuitry, including synthesized circuitry corresponding to each macro, may be placed within an area designated for the integrated circuit. The result may be analyzed, determining a location for the macro based on the location of the corresponding synthesized circuitry. For example, the geometric center of the synthesized circuitry may be located, and the geometric center of the custom circuitry associated with the macro may be placed at the same point as the geometric center of the synthesized circuitry. Because the macros are not placed in advance, the location of the macro may be controlled by other factors such as timing, space, wiring congestion, etc.

In some cases, the synthesis result may lead the designer to replace one or more macros with the synthesized result. For example, the synthesized result may be widely spaced or irregular, which may indicate that the overall integrated circuit might be better served by the synthesized result rather than the macro. In some embodiments, the synthesis may be performed flat at the integrated circuit level (eliminating hierarchy in the RTL files). The synthesis result may thus include circuitry from a block that is located at disparate locations around the integrated circuit. In such cases, the block may be divided into multiple sub blocks with the logic corresponding to the different locations being included in different sub blocks.

BRIEF DESCRIPTION OF THE DRAWINGS

The following detailed description makes reference to the accompanying drawings, which are now briefly described.

Figure 1:
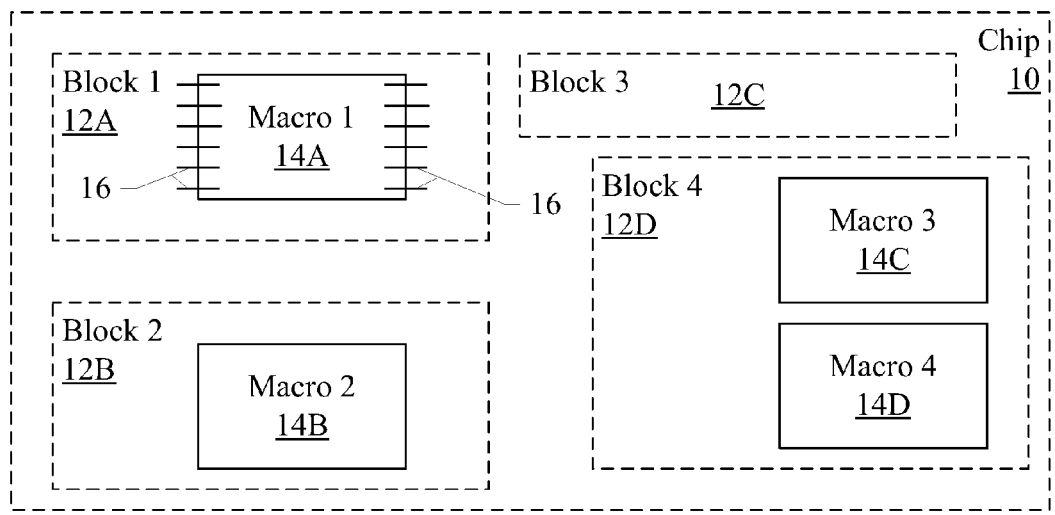
FIG. 1 is a block diagram of one embodiment of a chip design.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of an integrated circuit "chip" 10 is shown. As shown in FIG. 1, the chip 10 includes blocks 12A-12D, some of which include macros 14A-14D. Specifically, in FIG. 1, the block 12A includes the macro 14A, the block 12B includes the macro 14B, and the block 12D includes the macros 14C-14D in the embodiment of FIG. 1. The block 12C does not include any macros in the illustrated embodiment. Any number of blocks may be provided in various embodiments of the chip 10, and any number of macros may be included in the various blocks of the chip 10 in other embodiments.

FIG. 1 illustrates the hierarchy of the design files (e.g. RTL or other HDL descriptions of the design). That is, the chip 10 may be the top level design description, which may instantiate the next level of design description (the blocks 12A-12D) and may describe the connection between the blocks (not shown in FIG. 1). For example, each instantiation of a block may list the block's inputs and outputs. The inputs and outputs may be associated with signal names in the chip 10 description, and the same signal names may be used on inputs/outputs of other block instantiations to connect inputs and outputs of various blocks. The blocks 12A-12D may instantiate the macros 14A-14D, as shown in FIG. 1, and may describe the connection of macros to other logic described in the blocks 12A-12D (e.g. control logic). The macro connections may be described similar to the block connections. There may also be additional levels of hierarchy, not shown in FIG. 1. For example, a given block 12A-12D may have multiple sub blocks. One or more of the sub blocks may themselves have sub blocks, etc.

The hierarchy of design files may generally be provided to ease the management of information describing the chip 10. When the chip 10 is actually constructed, the logic circuitry and macros that implement a block 12A-12D may be placed within the area of the chip 10 that is assigned to that block 12A-12D, but the hierarchy of blocks may otherwise not be apparent. Accordingly, any number of levels of hierarchy may be used in other embodiments.

FIG. 1 (and FIGS. 2 and 3 below) illustrate the physical placement of blocks and macros within blocks. Thus, the dotted box representing the chip 10 may represent the area that the chip 10 is specified to occupy. That is, one of the specifications that the chip 10 is expected to meet is to occupy no more than a given amount of area (on the semiconductor substrate on which the chip 10 is fabricated). The area specified for the chip 10 may be divided up among the blocks 12A-12D, and the macros may be placed within the blocks at various physical locations as well.

In addition to having a defined aspect ratio (width and height), macros also define the physical location of the pins on the macro. The pins may be connection points to the macros, each pin corresponding to an input or output of the macro. For example, the macro 14A may have pins 16 on the right and left sides of the macro, as illustrated in FIG. 1. Other macros 14B-14D may generally also have pins, not shown in FIG. 1. Similarly, each block 12A-12D may have pins for input/output signals of the block (to be connected to pins of other blocks or external package pins of the chip 10, not shown in FIG. 1).

FIG. 1 may illustrate a manual placement of the blocks 12A-12D and the macros 14A-14D within the blocks 12A-12D, based on various factors that the designer may take into consideration. The designer may use a placement tool to place the blocks, and the placement tool may have automatic placement functionality in some cases to suggest a placement based on similar factors that the designer might consider.

Generally, a macro may include any predesigned circuitry that may be instantiated in a block or integrated circuit. For example, storage macros may be defined that include storage useable by the block to store data. The storage macros may include memory arrays (e.g. static random access memory (SRAM), arrays of flip-flops ("flops"), register banks, compiled register files or memory arrays, etc.). The storage macros may densely pack the storage devices, using a smaller area to implement the desired storage than if discrete clocked storage devices were used. Generally, a clocked storage device may include any circuitry configured to capture and transmit data responsive to a clock signal (e.g. flops, latches, registers, etc.).

Macros may also include various types of data flow devices. For example, macros may be defined for multiplexors ("muxes"), arithmetic devices (e.g. adders, multipliers, shifters, rotators, etc.), etc. Furthermore, in some cases, a chip 10 may include circuitry developed by third parties. The third party circuitry may be included in the design as either a hard macro (circuit layout) or a soft macro (HDL description that may be synthesized). Certain macros are also sometimes referred to as "megacells" since they are generally substantially larger than standard cells that are used by synthesis tools to synthesis logic.

A synthesis tool may be any program that is executable on a computer to read HDL descriptions, such as RTL or behavioral descriptions, and generate a description of logic circuitry and interconnect that implement the HDL descriptions. The description output by the synthesis tool is often referred to as a "net list." The synthesis tool may use a library of standard cells, which are predefined circuits that implement logic gates, compound implementations of multiple gates, etc. Thus, the net list may include instantiations of standard cells with inputs and outputs connected to each other. The synthesis tool may be timing and space driven, attempting to find implementations of the blocks that fit within space constraints and which may meet timing constraints.

The result of synthesis (e.g. the net lists) may be provided to a placement tool. The placement tool may receive definitions for each cell, describing the size of the cell/macro, it's width and height, and it's connection points. The placement tool may place the standard cells instantiated in the net list, attempting to provide a placement that will be successfully routable by a routing tool that may operate on the placed result. In the embodiment of FIG. 1, the macros 14A-14D have been pre-placed (prior to synthesis) and the placement tool may place circuitry defined in the net list around the pre-placed macros 14A-14D (not shown in FIG. 1).

Figure 2:
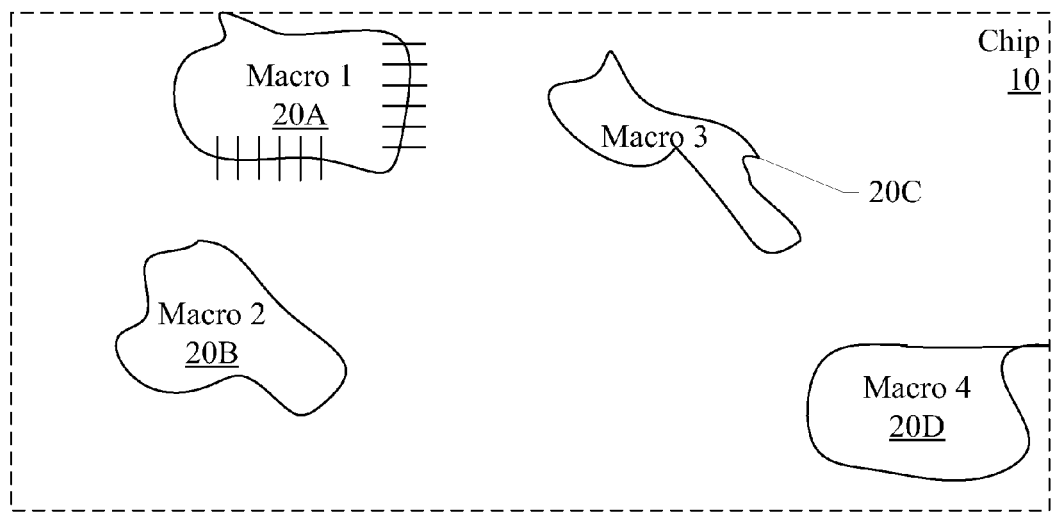
FIG. 2 is a block diagram of one embodiment of the chip design subsequent to synthesis and placement.

FIG. 2 illustrates an embodiment in which the synthesis tool has been used to synthesize the chip, including synthesizing a functional description of the macros 14A-14D. That is, rather than placing the macros 14A-14D and synthesizing the remaining logic, HDL descriptions of the macros 14A-14D may be synthesized along with the other logic described in the blocks 12A-12D. The HDL (e.g. RTL) descriptions of the macros may be functional descriptions describing the operation of the macros. The synthesis result may then be placed, including various synthesized circuitry that implements the macros (reference numerals 20A-20D in FIG. 2 corresponding to macros 14A-14D respectively). For example, a storage macro may be synthesized into discrete clocked storage devices such as flops, latches, registers, etc.

Permitting the synthesis tool to synthesize the macros 14A-14D along with other logic circuitry and placing the result may lead to a more optimal placement of the macros 14A-14D. Instead of flowing the other circuitry around the pre-placed macros 14A-14D, all of the logic including the macros 14A-14D may be placed in a more natural fashion. The resulting design may be more efficient in terms of space, timing, and/or power consumption.

In some cases, the synthesis result may indicate that a macro should be considered for removal in favor of a synthesized circuit. For example, a macro may be considered for removal if the shape of the resulting circuitry differs significantly from the shape of the macro itself. Alternatively, if the corresponding synthesized circuit is placed in two or more disparate locations on the chip 10, the macro may be considered for removal. As an alternative to removal, a macro may be considered for redesign in either case above and/or in other cases.

For example, the synthesized circuit 20C corresponding to the macro 14C in FIG. 2 may be more spread out and irregular than the macro 14C in FIG. 1. Accordingly, it may be a more optimal choice for the overall chip 10 if the macro 14C were not implemented and instead the corresponding synthesized circuit 20C shown in FIG. 2 may be used.

Additionally, in some embodiments, the pins of a given macro may be relocatable by the synthesis tool. If the pins are located differently in the synthesized result as compared to the original design, modifying the design to move the pins may be considered. For example, in FIG. 2, the synthesized circuit 20A corresponding to the macro 14A has pins on the right and bottom as shown in FIG. 2, rather than the right and left as shown in FIG. 1. In some embodiments, it may be desirable to limit the number of pins that may be moved (e.g. to about 5% of the pins). Limiting pin relocation may particularly be desirable for macros that are purchased from a third party.

It is noted that the corresponding synthesized circuit for a macro may frequently be significantly larger (in terms of area) than the predesigned circuit provided for the macro. For example, the synthesized circuit might be expected to be about 2 to 3 times larger than the predesigned circuit, depending on the functionality implemented in the macro, the efficiency of the synthesis tool, etc. Such an expansion in the size of the macro might skew synthesis results. In order to combat the size increase, the circuitry that may be used by the synthesis tool to implement the macro (e.g. discrete flops, for a storage macro implemented as a flop array) may be scaled in size when provided to the placement tool. In some embodiments, a library exchange format (LEF) file may be defined for each cell and macro. The LEF file may specify a bounding box for the circuit, defining the space that the circuit consumes, as well as connection points for inputs and outputs within the bounding box. By scaling the bounding box by, for example ½ to ⅓ in each dimension, the effect of the 2 to 3 times area expansion may be countered.

The final placement of the macros that are not eliminated may be based on the synthesized circuits 20A-20D. That is, the macros 14A-14D may be placed to approximate the position of the corresponding circuits 20A-20D. In an embodiment, for example, the geometric center of each circuit 20A-20D may be located and the corresponding macro 14A-14D may be placed so that it's geometric center is at the same point on the chip 10 as the corresponding geometric center of the circuit 20A-20D. In an embodiment, another mechanism for determining if a macro 14A-14D should be considered for removal may be if the geometric center of the synthesized circuit lies outside the boundary of the circuit. Formally, the geometric center of a two dimensional object may be the intersection of all straight lines that divide the object into two parts of equal moment about the line. Less formally, the geometric center may be the average of the points within the object. The geometric center may also be referred to as the centroid.

Figure 3:
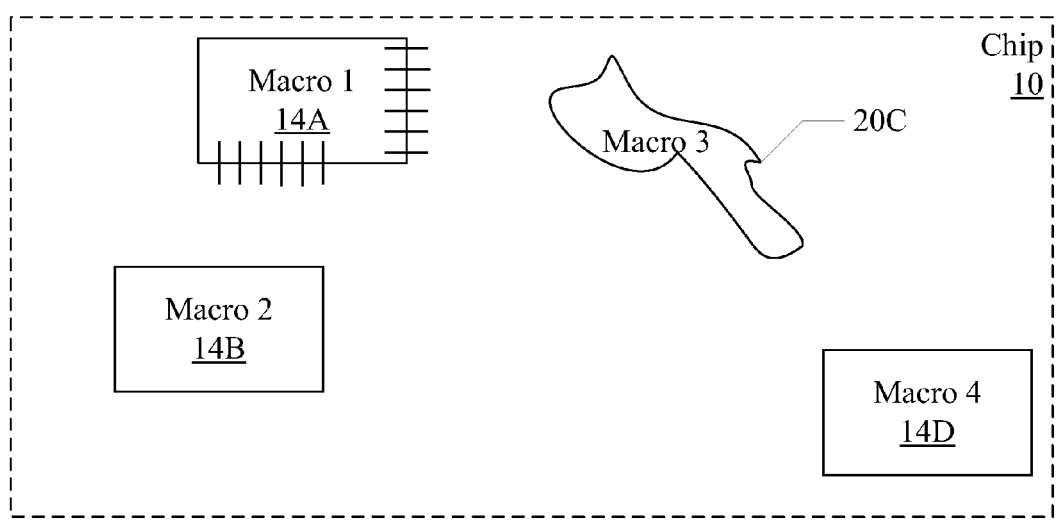
FIG. 3 is a block diagram of one embodiment of the chip design with macro placements made according to the synthesis results.

FIG. 3 is an example of placing the macros 14A-14B and 14D based on the synthesis results illustrated in FIG. 2 (as well as changing the placement of the pins on the macro 14A based on the synthesis result). In this example, the macro 14C has been eliminated as well in favor of the synthesized circuit 20C.

It is noted that FIGS. 2 and 3 do not illustrate the boundaries of the blocks 12A-12D as shown in FIG. 1. In an embodiment, the synthesis may be performed flat at the level of the chip 10. That is, all of the hierarchy may be removed and the synthesis and placement tools may be permitted to synthesis the chip circuitry as a whole.

Figure 4:
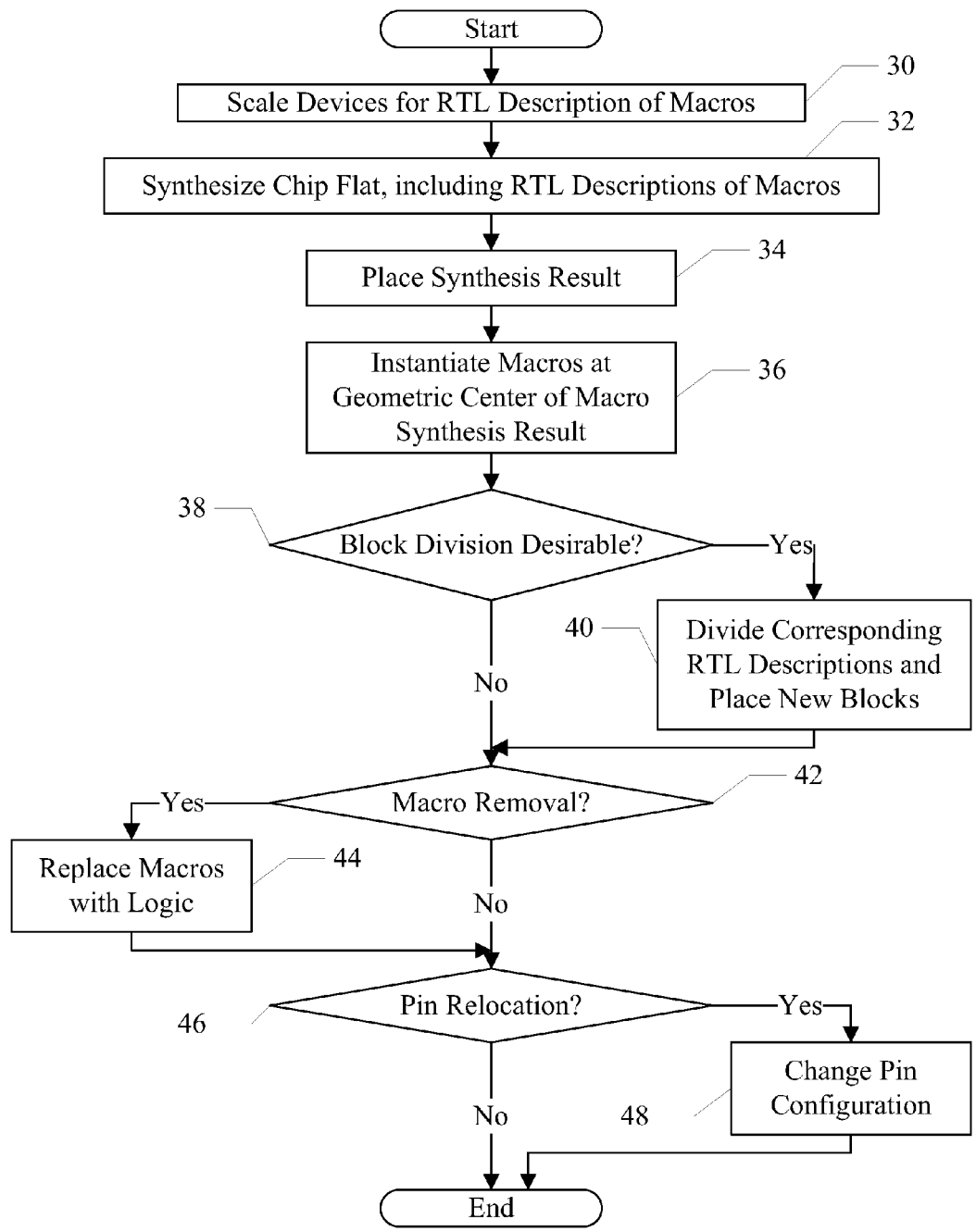
FIG. 4 is a flowchart illustrating one embodiment of using synthesis to determine macro placement.

FIG. 4 is a flowchart illustrating one embodiment of using synthesis to place macros in an integrated circuit. In an embodiment, all or a portion of the operation illustrated in the flowchart of FIG. 4 may be implemented in one or more programs executed on a computer. While the blocks are shown in a particular order for ease of understanding, other orders may be used. The programs may include instructions which, when executed, implement the operation described for those programs. It is noted that programs may include compiled programs executable directly on a processor in a computer as well as interpreted programs such as scripts which are performed via software executing on the computer. One such program may be a macro tool which may be executed to implement elements of the flowchart of FIG. 4 and which may invoke other tools such as the synthesis tool and the placement tool.

The macro tool may scale the devices used to implement the RTL descriptions of macros in the integrated circuit design (block 30). The macro tool may invoke the synthesis tool to synthesize the integrated circuit design flat, including the RTL descriptions of the macros (block 32). In this embodiment, the synthesis tool may support flattening of the design hierarchy. In other embodiments, the macro tool may first generate a flattened representation of the design and then invoke the synthesis tool to operate on the flattened representation. In another embodiment, the macro tool may synthesis only a portion of the integrated circuit (e.g. one block, or a subset of the blocks in the chip 10). The macro tool may invoke the placement tool to place the net list resulting from the synthesis (block 34). In the case of the circuitry corresponding to the macros, the scaled circuitry may be used. The macro tool may locate the geometric center of the synthesized circuits corresponding to the macros, and may instantiate the macro circuits at the geometric centers (block 36).

In some embodiments, the macro tool may also determine if one or more of the blocks instantiated at the top level of the integrated circuit (e.g. the blocks 12A-12D in FIG. 1) should be divided into two or more blocks (decision block 38). For example, if circuitry resulting from synthesizing the block is placed at multiple disparate locations on the chip 10 (e.g. with circuitry from other blocks intervening), it may be desirable to divide the blocks. If so (decision block 38, "yes" leg), the macro tool may divide the corresponding RTL description into multiple blocks and place the new blocks (block 40). Alternatively, the macro tool may simply suggest to the user that the block be divided. The user may then divide the RTL description and place the blocks.

As mentioned previously, the macro tool may determine, from the synthesis result, that one or more macros should be removed (decision block 42, "yes" leg). If so, the macro tool may replace the macros with the corresponding logic (RTL) description (block 44). Alternatively, the macro tool may identify the macro for further analysis.

In some embodiments, the pin locations of the macros may be relocated according to the synthesis result. If so (decision block 46, "yes" leg), the macro tool may relocate the pins on the macro (or identify the macro for pin relocation) (block 48).

Computer Accessible Storage Medium and System

Figure 5:
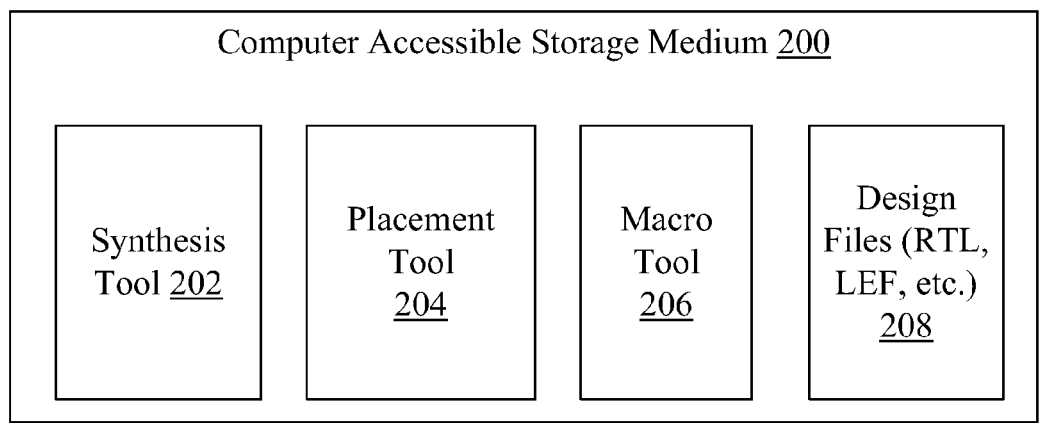
FIG. 5 is a block diagram of one embodiment of a computer accessible storage medium.

Turning now to FIG. 5, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. Storage media may also include non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link.

The computer accessible storage medium 200 in FIG. 5 may store a synthesis tool 202, a placement tool 204, a macro tool 206, and/or one or more design files 208 (e.g. RTL or other HDL descriptions, LEF files, net lists, schematics, and/or general data set II (GDSII) data describing mask objects, etc.). The synthesis tool 202 may include instructions which, when executed on a computer, may implement the operation described for the synthesis tool above. Similarly, the placement tool 204 may include instructions which, when executed on a computer, may implement the operation described for the placement tool above. The synthesis tool 202 and/or the placement tool 204 may include any commercially-available tools from a variety of different vendors (e.g. Synopsys, Cadence, etc.). The macro tool 206 may include instructions which, when executed on a computer, may implement the operation described for the macro tool above. For example, the macro tool 204 may include instructions which, when executed, implement the operation described above for the macro tool with regard to FIG. 4. A carrier medium may include computer accessible storage media as well as transmission media such as wired or wireless transmission.

Figure 6:
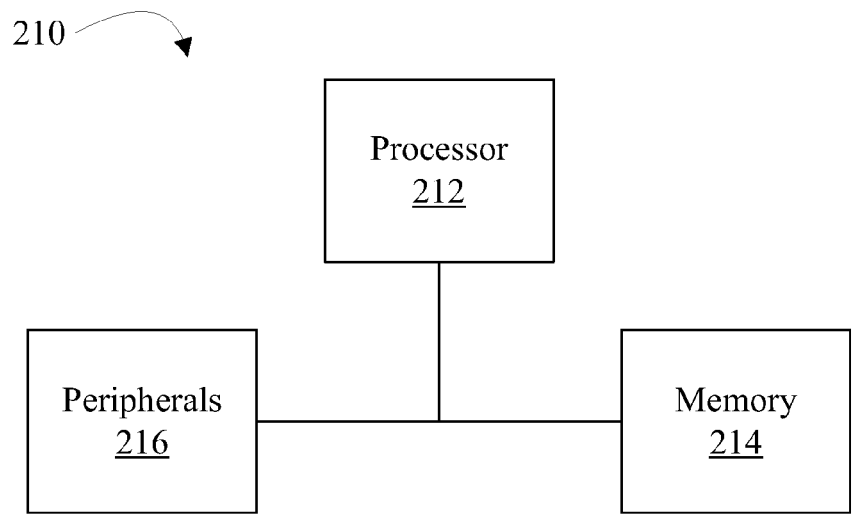
FIG. 6 is a block diagram of one embodiment of a computer system.

FIG. 6 is a block diagram of one embodiment of an exemplary computer system 210. In the embodiment of FIG. 6, the computer system 210 includes a processor 212, a memory 214, and various peripheral devices 216. The processor 212 is coupled to the memory 214 and the peripheral devices 216.

The processor 212 is configured to execute instructions, including the instructions in the software described herein such as the tools 202, 204, and 206. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to coupled the processor 212, the memory 214, and the peripheral devices 216.

The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use, data to be operated upon by the processor 212 during use, etc.

Numerous variations and modifications will become apparent to those skilled in the art once the above disclosure is fully appreciated. It is intended that the following claims be interpreted to embrace all such variations and modifications.

What is claimed is:

1. A non-transitory computer accessible storage medium storing a plurality of instructions which, when executed:
    invoke a synthesis tool to synthesize a plurality of blocks, wherein at least one of the blocks includes at least one macro, and wherein the macro is represented in the at least one block for the synthesis tool as a synthesizable description;
    invoke a placement tool to place a result of the synthesis tool, wherein the result includes synthesized circuitry corresponding to the macro; and
    analyze the placement of the synthesized circuitry to determine a location at which a predesigned circuit corresponding to the macro is to be instantiated within an integrated circuit, wherein the predesigned circuit is designed prior to synthesis of the plurality of blocks.

2. The non-transitory computer accessible storage medium as recited in claim 1 wherein the plurality of instructions, when executed, scale dimensions of the synthesized circuitry corresponding to the macro to account for an expected size increase between a size of the predetermined circuit that corresponds to the macro and a size of the synthesized circuitry prior to scaling.

3. The non-transitory computer accessible storage medium as recited in claim 2 wherein the expected size increase is about 2 to 3 times the size of the predesigned circuit, and wherein the scaling comprises scaling the dimensions by about one half to one third.

4. The non-transitory computer accessible storage medium as recited in claim 1 wherein the location is a geometric center of the synthesized circuitry subsequent to placement by the placement tool.

5. The non-transitory computer accessible storage medium as recited in claim 1 wherein the synthesis tool performs a flat synthesis in which hierarchy in the plurality of blocks is removed.

6. The non-transitory computer accessible storage medium as recited in claim 1 wherein the plurality of instructions, when executed, replace a first macro in the plurality of blocks with the synthesized circuitry responsive to analyzing the placement.

7. A computer system comprising:
    a processor configured to execute instructions; and
    a computer accessible storage medium coupled to the processor and storing a plurality of instructions which, when executed by the processor:
        invoke a synthesis tool to synthesize a plurality of blocks, wherein at least one of the blocks includes at least one macro, and wherein the macro is represented in the at least one block for the synthesis tool as a synthesizable description;
        invoke a placement tool to place a result of the synthesis tool, wherein the result includes synthesized circuitry corresponding to the macro; and
        analyze the placement of the synthesized circuitry to determine a location at which a predesigned circuit corresponding to the macro is to be instantiated within an integrated circuit, wherein the predesigned circuit is designed prior to synthesis of the plurality of blocks.

8. The computer system as recited in claim 7 wherein the plurality of instructions, when executed, scale dimensions of the synthesized circuitry corresponding to the macro to account for an expected size increase between a size of the predetermined circuit that corresponds to the macro and a size of the synthesized circuitry prior to scaling.

9. The computer system as recited in claim 8 wherein the expected size increase is about 2 to 3 times the size of the predesigned circuit, and wherein the scaling comprises scaling the dimensions by about one half to one third.

10. The computer system as recited in claim 7 wherein the location is a geometric center of the synthesized circuitry subsequent to placement by the placement tool.

11. The computer system as recited in claim 7 wherein the synthesis tool performs a flat synthesis in which hierarchy in the plurality of blocks is removed.

12. The computer system as recited in claim 7 wherein the plurality of instructions, when executed, replace a first macro in the plurality of blocks with the synthesized circuitry responsive to analyzing the placement.

13. A method comprising:
   a computer executing a synthesis tool to synthesize a plurality of blocks, wherein at least one of the blocks includes at least one macro, and wherein the macro is represented in the at least one block for the synthesis tool as a synthesizable description;
   the computer executing a placement tool to place a result of the synthesis tool, wherein the result includes synthesized circuitry corresponding to the macro; and
   analyzing the placement of the synthesized circuitry to determine a location at which a predesigned circuit corresponding to the macro is to be instantiated within an integrated circuit, wherein the predesigned circuit is designed prior to synthesizing the plurality of blocks.

14. The method as recited in claim 13 further comprising the computer scaling dimensions of the synthesized circuitry corresponding to the macro to account for an expected size increase between a size of the predetermined circuit that corresponds to the macro and a size of the synthesized circuitry prior to scaling.

15. The method as recited in claim 14 wherein the expected size increase is about 2 to 3 times the size of the predesigned circuit, and wherein the scaling comprises scaling the dimensions by about one half to one third.

16. The method as recited in claim 13 wherein the location is a geometric center of the synthesized circuitry subsequent to placement by the placement tool.

17. The method as recited in claim 13 wherein the synthesis tool performs a flat synthesis in which hierarchy in the plurality of blocks is removed.

18. The method as recited in claim 13 further comprising replacing a first macro in the plurality of blocks with the synthesized circuitry responsive to analyzing the placement.

* * * * *